US012733463B2

(12) United States Patent
Patel et al.

(10) Patent No.: US 12,733,463 B2
(45) Date of Patent: Sep. 8, 2026

(54) BUFFER LAYER FOR DIELECTRIC PROTECTION IN PHYSICAL VAPOR DEPOSITION METAL LINER APPLICATIONS

(71) Applicant: Applied Materials, Inc., Santa Clara, CA (US)

(72) Inventors: Sahil Patel, Sunnyvale, CA (US); Wei Lei, Campbell, CA (US); Xingyao Gao, Sunnyvale, CA (US); Shirish A. Pethe, Cupertino, CA (US); Yu Lei, Belmont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 433 days.

(21) Appl. No.: 17/977,411

(22) Filed: Oct. 31, 2022

(65) Prior Publication Data

US 2024/0145300 A1 May 2, 2024

(51) Int. Cl.
*H10W 20/00* (2026.01)
*H10P 14/40* (2026.01)
(Continued)

(52) U.S. Cl.
CPC ......... *H10W 20/032* (2026.01); *H10P 14/412* (2026.01); *H10P 72/0402* (2026.01); *H10P 72/3202* (2026.01)

(58) Field of Classification Search
CPC ......... H01L 21/76841; H01L 21/32051; H01L 21/67017; H01L 21/67706; H01L 21/2855;
(Continued)

(56) References Cited

U.S. PATENT DOCUMENTS 6,197,167 B1 * 3/2001 Tanaka .................. C23C 14/345 204/192.15
6,258,710 B1 7/2001 Rathore et al.
(Continued)

FOREIGN PATENT DOCUMENTS

CN 104752307 A * 7/2015 ............ H01L 21/311
WO WO 2008/027215 A2 3/2008

OTHER PUBLICATIONS

International Search Report and Written Opinion mailed May 28, 2010 for PCT Application No. PCT/US2009/061601.
(Continued)

*Primary Examiner* — Mohammed Shamsuzzaman
(74) *Attorney, Agent, or Firm* — Moser Taboada

(57) ABSTRACT

Methods and apparatus for processing a substrate are provided. In some embodiments, a method includes: depositing a metal buffer layer on a substrate and within a feature disposed in a dielectric layer of the substrate. The buffer layer is deposited using a first physical vapor deposition (PVD) process at a chamber pressure of less than 500 mTorr while applying less than or equal to 0.08 watts/cm$^2$ of RF bias power to the substrate if the chamber pressure is less than or equal to 3 mTorr and applying less than or equal to 0.8 watts/cm$^2$ of RF bias power to the substrate if the chamber pressure is greater than 3 mTorr. A metal liner layer is deposited atop the buffer layer using a second PVD process at a chamber pressure of less than or equal to 3 mTorr while applying greater than 0.08 watts/cm$^2$ of RF bias power to the substrate.

14 Claims, 5 Drawing Sheets

(51) Int. Cl.
*H10P 72/00* (2026.01)
*H10P 72/30* (2026.01)

(58) Field of Classification Search
CPC ......... H01L 21/76843; H01L 21/76846; H01L 21/76865
See application file for complete search history.

(56) References Cited

U.S. PATENT DOCUMENTS 6,284,652 B1 9/2001 Charneski et al.
6,566,259 B1 5/2003 Ding et al.
10,381,307 B1 * 8/2019 Lien .................... H01L 23/5226
10,937,692 B2 * 3/2021 Liu ................... H01L 21/76873
2004/0029377 A1 * 2/2004 Lee ................... H01L 21/76846 257/E21.169
2004/0048461 A1 * 3/2004 Chen ................. H01L 21/76871 438/653
2004/0140196 A1 * 7/2004 Gopalraja ......... H01L 21/76877 257/E21.585
2005/0006222 A1 * 1/2005 Ding ....................... C23C 14/35 204/192.12
2005/0023686 A1 * 2/2005 Lin .................. H01L 21/76846 257/762
2005/0255690 A1 * 11/2005 Chen ................. H01L 21/76843 438/643
2006/0009030 A1 * 1/2006 Griffin, Jr. ........ H01L 21/76829 257/E23.145
2006/0211228 A1 * 9/2006 Matsuda ................. C23C 16/18 438/575
2007/0059502 A1 * 3/2007 Wang ................ H01L 21/76873 428/209
2007/0085209 A1 * 4/2007 Lu ..................... H01L 21/76802 257/E23.145
2007/0095654 A1 * 5/2007 Gopalraja ......... H01L 21/76843 204/192.15
2008/0008823 A1 * 1/2008 Chen ................. C23C 16/45525 257/E21.171
2009/0280643 A1 * 11/2009 Andry ............... H01L 21/76898 257/E21.585
2010/0105203 A1 * 4/2010 Fu ....................... H01L 21/2855 438/643
2012/0034757 A1 * 2/2012 Choi ................. H01L 21/76229 257/E21.546
2012/0108058 A1 * 5/2012 Ha .................... H01L 21/76873 438/653
2012/0196437 A1 * 8/2012 Ishizaka ................ C23C 14/024 438/653
2013/0075246 A1 * 3/2013 Ge ...................... C23C 14/5873 204/192.15
2014/0305802 A1 * 10/2014 Ding ..................... C23C 14/046 204/298.16
2016/0104793 A1 * 4/2016 Ching .................. H10D 30/711 438/157
2019/0273147 A1 * 9/2019 Cheng ............... H01L 21/76826
2021/0143012 A1 5/2021 Huh
2021/0217622 A1 * 7/2021 Yang ................. H01L 21/76843

OTHER PUBLICATIONS

PCT International Search Report and Written Opinion mailed Feb. 6, 2024 for PCT Application No. PCT/US2023/035196.

* cited by examiner 300
302
304
305
306
308
309
310
CHUCK POWER SUPPLY
312
313
LIFT
314
316
RF MATCH
317
RF POWER SUPPLY
318
319
320
322
324
330
332
LIFT
336
340
342
344
346
348
350
354
356
370
380
384
390

BUFFER LAYER FOR DIELECTRIC PROTECTION IN PHYSICAL VAPOR DEPOSITION METAL LINER APPLICATIONS

FIELD

Embodiments of the present disclosure generally relate to thin film fabrication techniques.

BACKGROUND

Fabrication of integrated circuits and other microelectronic devices include processes to fill features formed in or on a substrate. Dimensions of the contacts to the source and drain regions, as well as the contact to the metal gate, have drastically decreased over time and continue to decrease. The inventors have observed that contact resistance in semiconductor devices increases dramatically with the reduction in contact and feature dimensions and that conventional methods of filling such features can produce unacceptably high resistance.

The inventors have further observed that a metal liner deposited by physical vapor deposition (PVD) in the feature can result in a very low contact resistance for the completed feature, such as a trench or via. However, depositing the metal liner within the feature often requires high energy species from the target, often further accelerated by a bias voltage on the substrate. The inventors have observed that such processing can undesirably result in metal species impregnation into the surrounding dielectric layer in which the feature is formed, which can cause electrical leakage between in or between device structures. The inventors have also observed that such processing can undesirably result in critical dimension (CD) changes in the feature due to metal species bombardment of the substrate, which can further cause downstream processing problems, such as due to changing margins for overlay for the for the designs.

Accordingly, the inventors have developed improved techniques to fill features with a conductive material.

SUMMARY

Methods and apparatus for processing a substrate are provided herein. In some embodiments, a method includes: depositing a metal buffer layer on a substrate and within a feature disposed in a dielectric layer of the substrate, wherein the buffer layer is deposited using a first physical vapor deposition (PVD) process at a chamber pressure of less than 500 mTorr, wherein during the first PVD process: applying less than or equal to 0.08 watts/cm$^2$ of RF bias power to the substrate if a chamber pressure is less than or equal to 3 mTorr; or applying less than or equal to 0.8 watts/cm$^2$ of RF bias power to the substrate if a chamber pressure is greater than 3 mTorr and less than or equal to 500 mTorr; and depositing a metal liner layer atop the buffer layer, wherein the liner layer is deposited using a second PVD process at a chamber pressure of less than or equal to 3 mTorr while applying greater than 0.08 watts/cm$^2$ of RF bias power to the substrate.

In some embodiments, a non-transitory computer readable medium is provided, having instructions stored thereon that, when executed, cause a method to be performed, the method comprising: depositing a metal buffer layer on a substrate and within a feature disposed in a dielectric layer of the substrate using a first physical vapor deposition (PVD) process at a chamber pressure of less than 500 mTorr while applying less than or equal to 0.08 watts/cm$^2$ of RF bias power to the substrate if the chamber pressure is less than or equal to 3 mTorr, and applying less than or equal to 0.8 watts/cm$^2$ of RF bias power to the substrate if the chamber pressure is greater than 3 mTorr; and depositing a metal liner layer atop the buffer layer, wherein the liner layer is deposited using a second PVD process at a chamber pressure of less than or equal to 3 mTorr while applying greater than 0.08 watts/cm$^2$ of RF bias power to the substrate.

In some embodiments, a system for processing a substrate includes: a first PVD chamber configured to deposit a metal buffer layer on a substrate and within a feature disposed in a dielectric layer of the substrate, wherein first PVD chamber is configured to deposit the buffer layer using a first physical vapor deposition (PVD) process at a chamber pressure of less than 500 mTorr while applying less than or equal to 0.08 watts/cm$^2$ of RF bias power to the substrate if the chamber pressure is less than or equal to 3 mTorr and applying less than or equal to 0.8 watts/cm$^2$ of RF bias power to the substrate if the chamber pressure is greater than 3 mTorr; and a second PVD chamber configured to deposit a metal liner layer atop the buffer layer, wherein the second PVD chamber is configured to deposit the liner layer using a second PVD process at a chamber pressure of less than or equal to 3 mTorr while applying greater than 0.08 watts/cm$^2$ of RF bias power to the substrate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
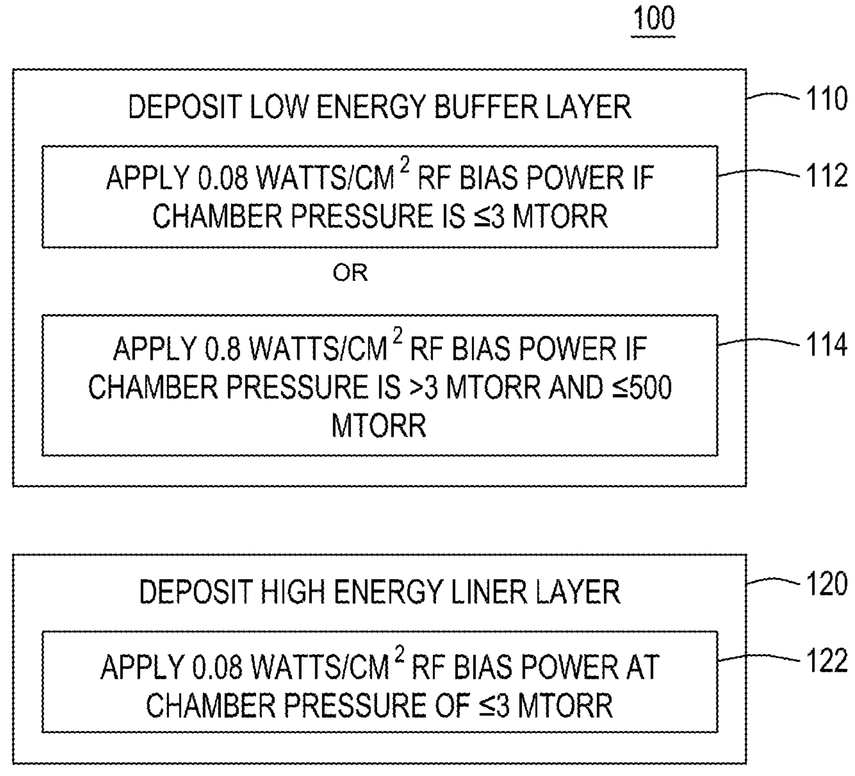
FIG. 1 is a flow chart of a method of depositing a liner in a feature in accordance with embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods for filling a feature on a substrate with a conductive material are provided herein. Embodiments of the inventive methods include depositing a conductive low energy buffer layer atop the substrate and within a feature disposed in or on the substrate, and depositing a conductive high energy liner layer atop the low energy buffer layer. The low energy buffer layer advantageously provides a buffer layer atop the substrate and within the feature that protects the bottom of the feature and the top surface of the substrate from high energy metal ions during subsequent deposition of the high energy liner layer. Thus, good coverage inside the feature can be obtained without causing a lot of damage from the high energy process.

FIG. 1 is a flow chart of a method 100 of depositing a liner in a feature in accordance with embodiments of the present disclosure. FIGS. 2A-2D respectively depict stages of processing of a substrate in accordance with embodiments of the present disclosure.

Figure 2A:
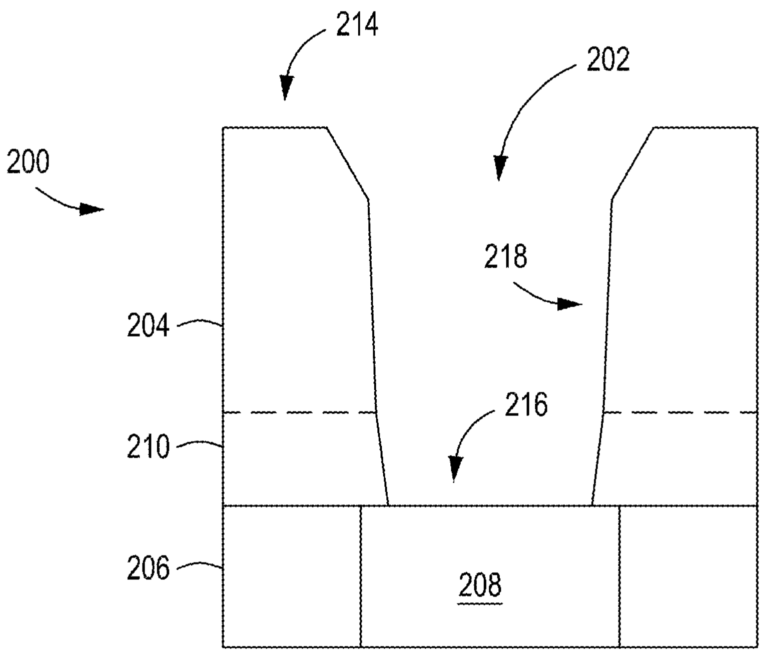
FIGS. 2A-2D respectively depict stages of processing of a substrate in accordance with embodiments of the present disclosure.

The method 100 can be performed on a substrate having a feature formed in or on a substrate of a certain size (e.g., 300 mm diameter). For example, as depicted in FIG. 2A, a substrate 200 includes a feature 202 formed in a dielectric layer 204, such as an interlayer dielectric of an electronic device or structure being fabricated. The feature 202 can be a trench, a via, or a dual damascene structure including one or more trenches and one or more vias. In some embodiments, the feature can have an opening size (e.g., a width) of about 5 nm to about 300 nm. The substrate 200 can include additional layers such as another dielectric layer 206 disposed beneath the dielectric layer 204. A conductive layer 208 can be disposed within the dielectric layers of the substrate, such as within dielectric layer 206 as depicted in FIG. 2A. In some embodiments, the conductive layer 208 can have an upper surface that at least partially defines a bottom of the feature 202. For example, the conductive layer 208 can be a contact pad, a conductive line, a portion of an electronic device such as a transistor, or some other component to which electrical contact is to be made through the feature 202, once filled. Other optional layers can include, for example, an etch stop layer 210 (shown in phantom) used for the fabrication of the feature during prior processing of the substrate 200. The feature 202 can be formed in a conventional manner and, optionally, a preclean process can be provided if needed prior to commencing the method 100.

Figure 2B:
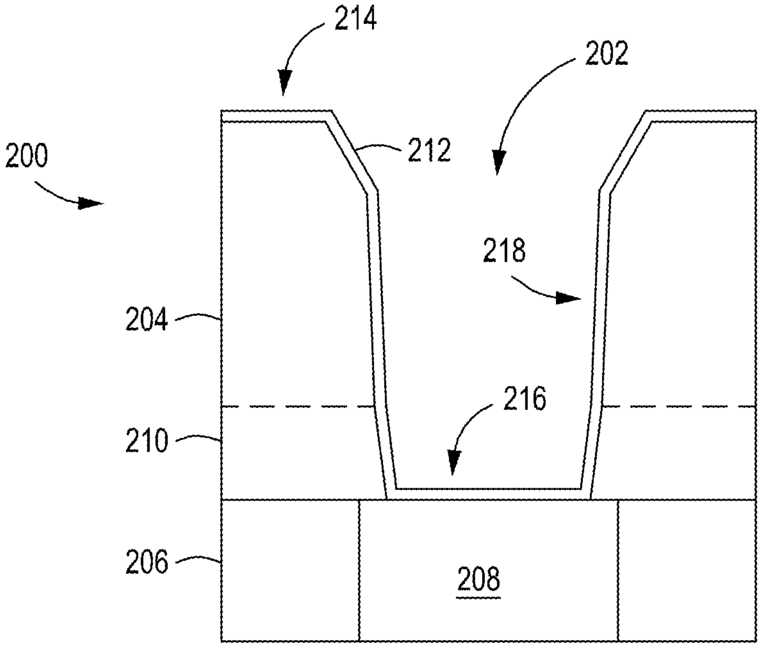

The method 100 generally begins at block 110, where a low energy buffer layer is deposited on a substrate and within a feature disposed in a dielectric layer of the substrate. For example, as depicted in FIG. 2B, a low energy buffer layer 212 is deposited on the substrate 200, and in particular, atop an upper surface 214 of the substrate 200 (e.g., atop dielectric layer 204) and within the feature 202, including on a bottom 216 (e.g., atop conductive layer 208) and sidewalls 218 of the feature 202 (e.g., atop dielectric layer 204).

The low energy buffer layer is a metal layer (e.g., a first metal layer). Examples of suitable metals to form the low energy buffer layer include but are not limited to cobalt, copper, molybdenum, ruthenium, tantalum, titanium, tungsten, nitrides thereof, and combinations thereof. For example, the low energy buffer layer can consist of or can consist essentially of cobalt, copper, molybdenum, ruthenium, tantalum, titanium, tungsten, nitrides thereof, and combinations thereof.

The low energy buffer layer is deposited using a low energy physical vapor deposition (PVD) process (e.g., a first PVD process) at a chamber pressure of less than or equal to 500 mTorr using little or no substrate bias. Substrate bias can be provided by an RF power supply providing, for example, RF energy at 13.56 MHz (although other frequencies can also be used). The amount of substrate bias power applied depends upon the chamber pressure. If the pressure within the PVD chamber is less than or equal to 3 mTorr, the RF bias power density applied to the substrate is less than or equal to 0.08 watts/cm$^2$, including zero watts or no RF bias power (as shown in block 112). If the pressure within the PVD chamber is greater than 3 mTorr, the RF bias power density applied is less than or equal to 0.8 watts/cm$^2$, including zero watts or no RF bias power (as shown in block 114).

Additional parameters of the low energy PVD process can include, for example, providing about 10 watts to about 50 kilowatts of continuous or pulsed DC power to a target comprising the metal to be deposited on the substrate while supplying an inert gas sufficient to maintain the desired chamber pressure. The low energy PVD process can be performed with a substrate temperature of about room temperature (e.g., about 25 degrees Celsius) to about 500 degrees Celsius).

In some embodiments, the low energy PVD process can be performed for a sufficient duration to deposit the low energy buffer layer to a thickness, as measured on the field of the substrate (e.g., the upper surface 214), of at least about 5 angstroms. In some embodiments, the thickness of the low energy buffer layer is equal to about 5 angstroms to about 50% of a width of the top of the feature (e.g., a feature width of about 5 nm to about 300 nm).

Figure 2C:
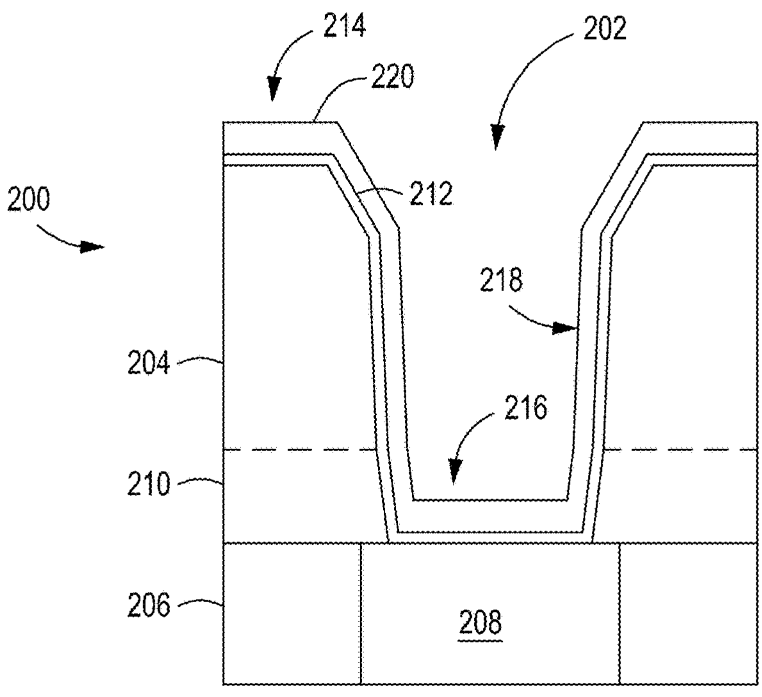

Next, at block 120, a high energy liner layer is deposited on the low energy buffer layer, atop the substrate and within the feature disposed in the dielectric layer of the substrate. For example, as depicted in FIG. 2C, a high energy liner layer 220 can be deposited on the substrate 200, and in particular, atop the upper surface 214 of the substrate and within the feature 202, including on the bottom 216 and sidewalls 218 of the feature 202 (e.g., atop the low energy buffer layer 212).

The high energy liner layer is a metal layer (e.g., a second metal layer). Examples of suitable metals to form the high energy liner layer include but are not limited to cobalt, copper, molybdenum, ruthenium, tantalum, titanium, tungsten, nitrides thereof, and combinations thereof. For example, the high energy liner layer can consist of or can consist essentially of cobalt, copper, molybdenum, ruthenium, tantalum, titanium, tungsten, nitrides thereof, and combinations thereof. The high energy liner layer can be the same metal as the low energy buffer layer or a different metal as the low energy buffer layer. The high energy liner layer is a metal that is compatible with a material to be deposited to fill the feature. The material used to fill the feature can be a metal, such as cobalt, copper, molybdenum, or tungsten.

The high energy liner layer is deposited with a higher energy process than the low energy buffer layer. For example, the high energy liner layer is deposited using a high energy PVD process (e.g., a second PVD process) at a chamber pressure of less than or equal to 3 mTorr. Substrate bias is provided by an RF power supply providing, for example, RF energy at 13.56 MHz (although other frequencies can also be used). Substrate bias is applied at a power density of greater than 0.08 watts/cm$^2$ (as shown in block 122).

Additional parameters of the high energy PVD process can include, for example, providing about 10 watts to about 50 kilowatts of continuous or pulsed DC power to a target comprising the metal to be deposited on the substrate while supplying an inert gas sufficient to maintain the desired chamber pressure. The low energy PVD process can be performed with a substrate temperature of about room temperature (e.g., about 25 degrees Celsius) to about 500 degrees Celsius).

In some embodiments, the high energy PVD process can be performed for a sufficient duration to deposit the high energy liner layer to a thickness, as measured on the field of the substrate (e.g., the upper surface 214), of at least about 5 angstroms. In some embodiments, the thickness of the high energy liner layer is equal to about 5 angstroms to about 50% of the width of the top of the feature (e.g., a feature width of about 5 nm to about 300 nm). In some embodiments, the maximum combined thickness of the low energy buffer layer and the high energy liner layer is about a depth of the feature to be filled. In some embodiments, the maximum combined thickness of the low energy buffer layer and the high energy liner layer is dictated by a thickness amount that will pinch off the opening of the feature as a result of the PVD process, which can be determined empirically for any particular process being performed.

In some embodiments, the high energy liner layer is deposited in the same PVD chamber (e.g., a first PVD chamber) as the low energy buffer layer. In some embodiments, the low energy PVD process continues until the low energy buffer layer is deposited to the desired thickness. Upon termination of the process, the PVD chamber can be controlled to prepare for and perform the high energy PVD process and deposit the high energy liner layer. The first PVD chamber can be a standalone chamber or part of an integrated tool (e.g., a cluster tool).

In some embodiments, the high energy liner layer is deposited in a different PVD chamber as the low energy buffer layer. In some embodiments, the low energy PVD process is performed in the first PVD chamber until the low energy buffer layer is deposited to the desired thickness. Upon termination of the process, the substrate can be transferred to a second PVD chamber to perform the high energy PVD process to deposit the high energy liner layer. In some embodiments, the transfer can occur without vacuum break. The first PVD chamber and the second PVD chamber can each be standalone chambers or part of an integrated tool (e.g., a cluster tool).

For example, in some embodiments, the low energy buffer layer can be deposited, and then in the same PVD chamber, the high energy liner layer can be deposited without transferring the substrate and without vacuum break. In some embodiments, the low energy buffer layer can be deposited in a first PVD chamber, and then in a different, second PVD chamber, the high energy liner layer can be deposited. The transfer from the first PVD chamber to the second PVD chamber can be done with or without vacuum break. However, if a vacuum break occurs, a preclean process may need to be performed prior to depositing the high energy liner layer.

Figure 2D:
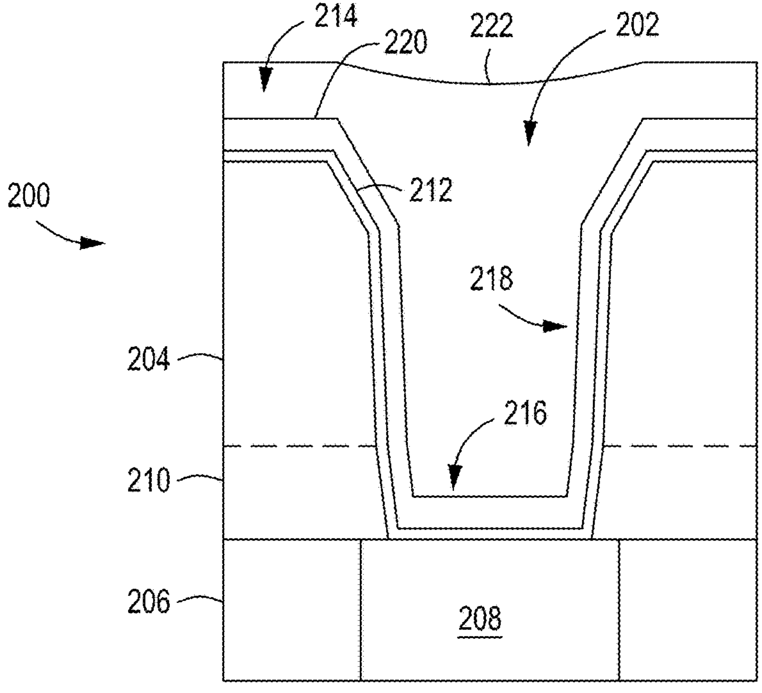

Upon completion of deposition of the high energy liner layer, the method 100 generally ends. However, the substrate can continue for additional processing, such as to deposit a conductive material atop the high energy liner layer to fill the feature (e.g., atop the substrate and within the feature disposed in the dielectric layer of the substrate). For example, as depicted in FIG. 2D, a fill layer 222 can be deposited on the substrate 200, and in particular, atop the upper surface 214 of the substrate and within the feature 202, including on the bottom 216 and sidewalls 218 of the feature 202 (e.g., atop the high energy liner layer 220). In some embodiments, the conductive material used to fill the feature is a metal, such as at least one of cobalt, copper, molybdenum, or tungsten.

In some embodiments, the fill process is a chemical vapor deposition (CVD) process. In some embodiments, the conductive material is a metal, for example, tungsten or molybdenum. In some embodiments, the CVD chamber can be part of an integrated tool containing a PVD chamber configured to deposit both the low energy buffer layer and the high energy liner layer. In some embodiments, the CVD chamber can be part of an integrated tool containing a first PVD chamber configured to deposit the low energy buffer layer and a second PVD chamber configured to deposit the high energy liner layer. In some embodiments, the CVD chamber can be separate from the PVD chamber or PVD chambers used to deposit the low energy buffer layer and the high energy liner layer.

Figure 3:
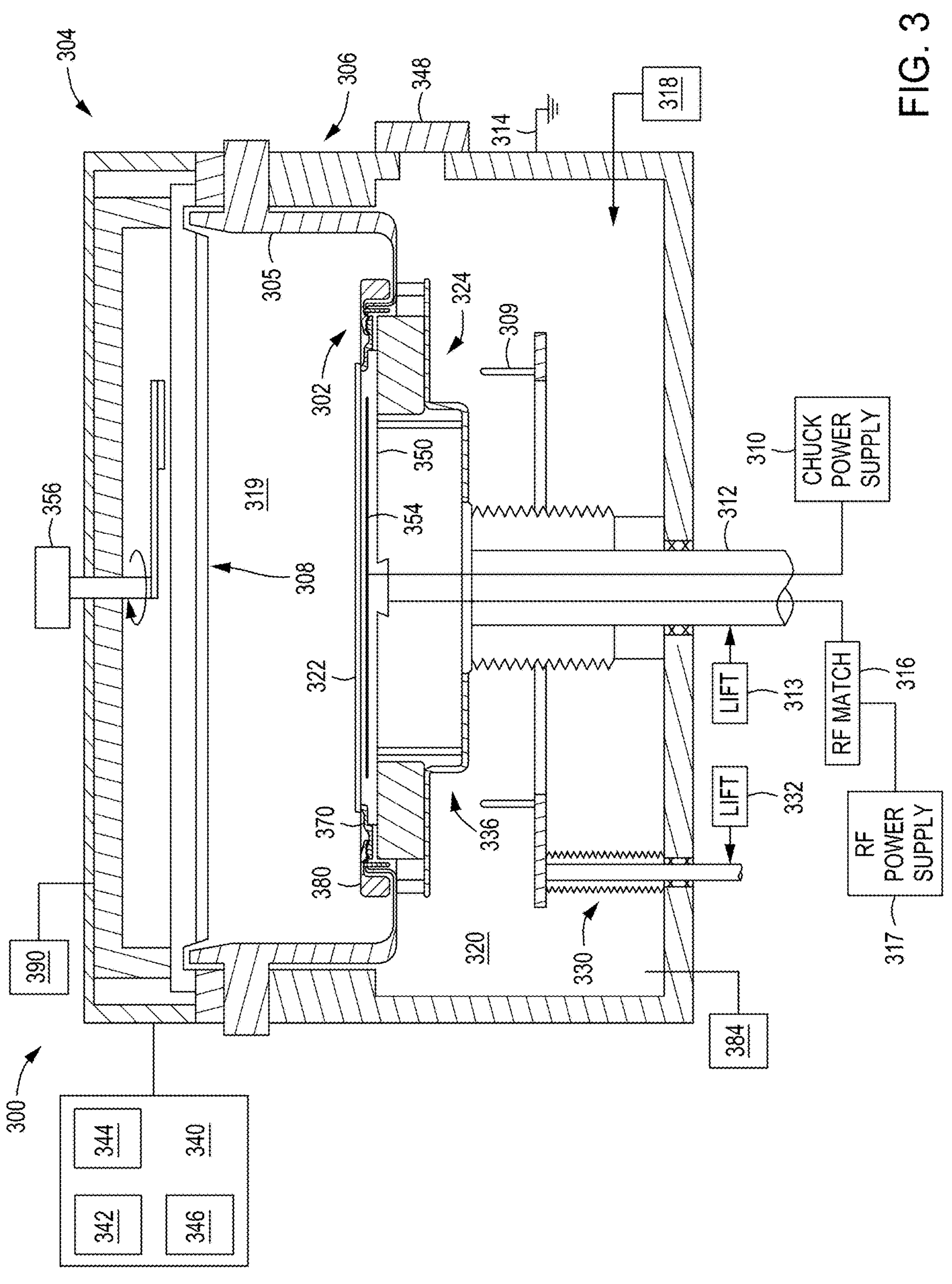
FIG. 3 depicts a schematic side view of a physical vapor deposition (PVD) chamber suitable for processing a substrate in accordance with embodiments of the present disclosure.

FIG. 3 depicts a schematic side view of a physical vapor deposition (PVD) chamber 300 configured for substrate processing in accordance with embodiments of the present disclosure. The PVD chamber 300 is a vacuum chamber which is suitably adapted to maintain sub-atmospheric pressures within an interior volume 320 during substrate processing. The PVD chamber 300 includes a chamber body 306 covered by a lid assembly 304 which encloses a processing volume 319 located in an upper portion of the interior volume 320. The chamber body 306 and lid assembly 304 may be made of metal, such as aluminum. The chamber body 306 may be grounded via a coupling to ground 314.

A substrate support 324 is disposed within the interior volume 320 to support and retain a substrate 322, such as a semiconductor wafer, for example, the substrate 200 during the method 100. The substrate support 324 may generally comprise an electrostatic chuck 350 disposed on a pedestal 336 and a hollow support shaft 312 for supporting the pedestal 336 and the electrostatic chuck 350. The electrostatic chuck 350 comprises a dielectric plate having one or more electrodes 354 disposed therein.

The hollow support shaft 312 provides a conduit to provide, for example, backside gases, process gases, fluids, coolants, power, or the like, to the electrostatic chuck 350. In some embodiments, the hollow support shaft 312 is coupled to a lift mechanism 313, such as an actuator or motor, which provides vertical movement of the electrostatic chuck 350 between an upper, processing position (as shown in FIG. 3) and a lower, transfer position (not shown).

The hollow support shaft 312 provides a conduit for coupling a chuck power supply 310 and an RF bias power supply 317 to the electrostatic chuck 350. In some embodiments, the RF bias power supply 317 is coupled to the electrostatic chuck 350 via an RF match network 316. In some embodiments, the substrate support 324 may alternatively or in combination include DC bias power.

A substrate lift 330 can include lift pins 309 coupled to a second lift mechanism 332 for raising and lowering the substrate lift 330 so that the substrate 322 may be placed on or removed from the electrostatic chuck 350. The electrostatic chuck 350 may include through holes to receive the lift pins 309.

A target 308, which acts as a cathode during processing, is disposed in the processing volume 319 opposite the substrate support 324. The substrate support 324 has a support surface having a plane substantially parallel to a sputtering surface of the target 308. The target 308 is connected to a DC power source 390. The DC power source 390 can apply continuous or pulsed power to the target 308.

The target 308 generally comprises a sputtering plate mounted to a backing plate, although a monolithic target can also be used (e.g., a sputtering plate without a backing plate). The target 308 comprises a material to be sputtered onto the substrate 322, such as the materials disclosed herein with respect to the method 100. In some embodiments, the PVD chamber 300 includes a magnetic field generator 356 (e.g., a magnetron) to shape a magnetic field about the target 308 to improve sputtering of the target 308.

The PVD chamber 300 includes a process kit 302 circumscribing various chamber components to prevent unwanted reaction between such components and ionized process material. The process kit 302 can include a process shield 305 surrounding the substrate support 324 and the target 308 to at least partially define the processing volume 319. For example, the process shield 305 may define an outer boundary of the processing volume 319. In some embodiments, the process shield 305 is made of a metal such as aluminum. The process shield 305 can include an outer flange that rests on the chamber body 306 to support the process shield in place.

In some embodiments, the process kit 302 includes a deposition ring 370 that rests on an outer edge of the electrostatic chuck 350. In some embodiments, the process kit 302 includes a cover ring 380 disposed on the process shield 305 to protect the substrate support 324.

The PVD chamber 300 is coupled to and in fluid communication with a vacuum system 384 which includes a gate valve or a throttle valve and vacuum pump which are used to exhaust the PVD chamber 300. The pressure inside the PVD chamber 300 may be regulated by adjusting the throttle valve, the vacuum pump, and/or the flow rate of gases provided to the PVD chamber 300. The PVD chamber 300 is also coupled to and in fluid communication with a process gas supply 318 which may supply one or more process gases to the PVD chamber 300 for processing the substrate 322 disposed therein. A slit valve 348 may be coupled to the chamber body 306 and aligned with an opening in a sidewall of the chamber body 306 to facilitate transferring the substrate 322 into and out of the chamber body 306.

A controller 340 controls the operation of the PVD chamber 300 using a direct control of the PVD chamber 300 or alternatively, by controlling the computers (or controllers) associated with the PVD chamber 300. In operation, the controller 340 enables data collection and feedback from the respective systems to control performance of the PVD chamber 300. The controller 340 generally includes a central processing unit (CPU) 342, a memory 344, and a support circuit 346. The CPU 342 may be any form of a general-purpose computer processor that can be used in an industrial setting. The support circuit 346 is conventionally coupled to the CPU 342 and may comprise a cache, clock circuits, input/output subsystems, power supplies, and the like. Software routines, such as methods as described herein may be stored in the memory 344 and, when executed by the CPU 342, transform the CPU 342 into a specific purpose computer (controller 340). The software routines may also be stored and/or executed by a second controller (not shown) that is located remotely from the PVD chamber 300.

The memory 344 is in the form of computer-readable storage media that contains instructions, when executed by the CPU 342, to facilitate the operation of the semiconductor processes and equipment. The instructions in the memory 344 are in the form of a program product such as a program that implements the methods of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Figure 4:
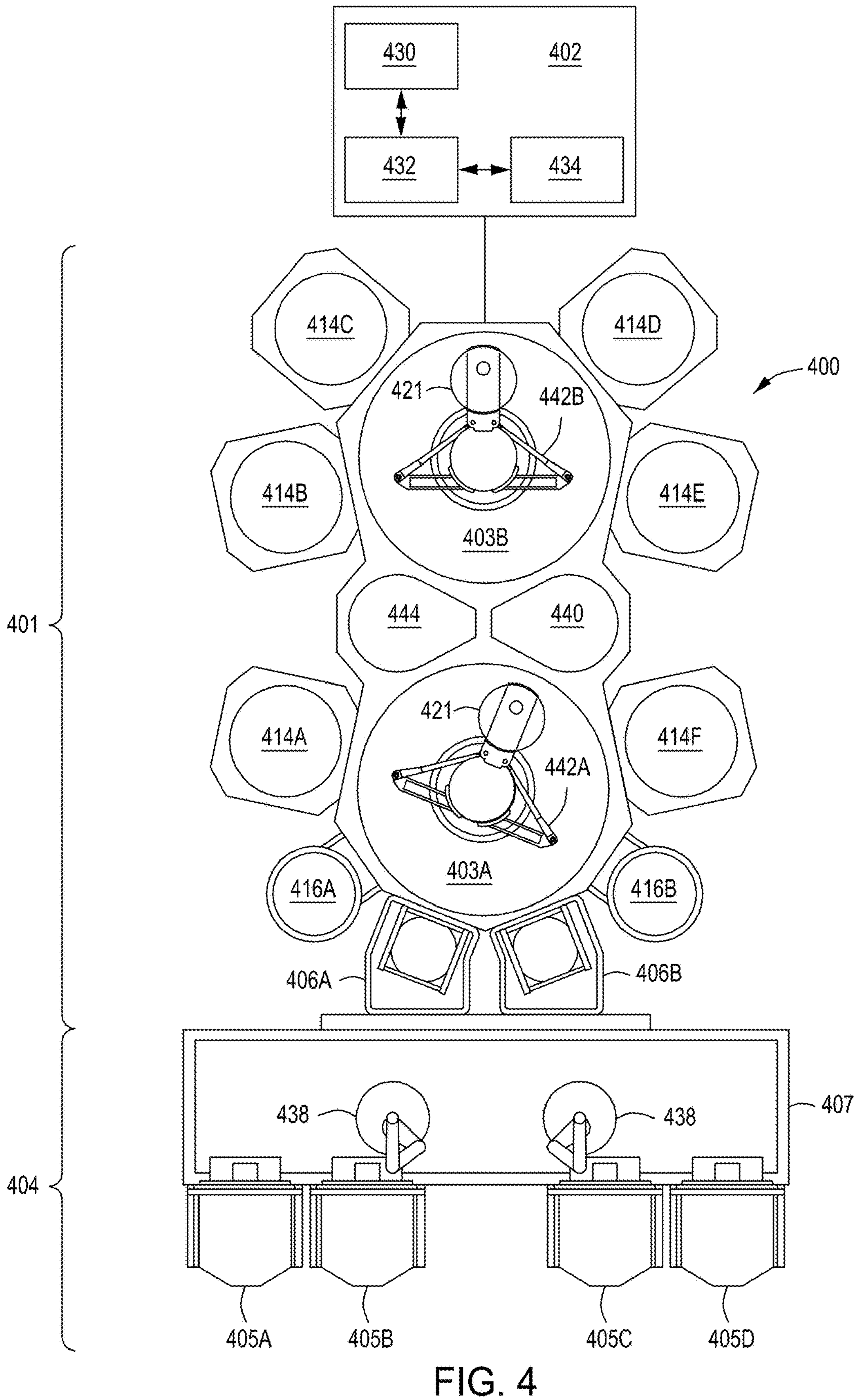
FIG. 4 depicts a schematic plan view of an integrated tool (e.g., cluster tool) suitable for processing a substrate in accordance with embodiments of the present disclosure.

The PVD chamber described in FIG. 3 above may be provided in a standalone configuration or as part of a cluster tool, for example, the integrated tool 400 (e.g., cluster tool) described below with respect to FIG. 4. The advantage of using an integrated tool 400 is that there is no vacuum break between chambers and, therefore, no requirement to degas and pre-clean a substrate before further processing. For example, in some embodiments the inventive methods discussed above may advantageously be performed in an integrated tool such that there are limited or no vacuum breaks between processes, limiting or preventing contamination of the substrate such as oxidation and the like. The integrated tool 400 includes a vacuum-tight processing platform 401, a factory interface 404, and a system controller 402. The processing platform 401 comprises multiple process chambers, such as 414A, 414B, 414C, 414D, 414E, and 414F operatively coupled to a vacuum substrate transfer chamber (transfer chambers 403A, 403B). The factory interface 404 is operatively coupled to the transfer chamber 403A by one or more load lock chambers (two load lock chambers, such as 406A and 406B shown in FIG. 4).

In some embodiments, the factory interface 404 comprises at least one docking station 407, at least one factory interface robot 438 to facilitate the transfer of the semiconductor substrates. The docking station 407 is configured to accept one or more front opening unified pod (FOUP). Four FOUPS, such as 405A, 405B, 405C, and 405D are shown in the embodiment of FIG. 4. The factory interface robot 438 is configured to transfer the substrates from the factory interface 404 to the processing platform 401 through the load lock chambers, such as 406A and 406B. Each of the load lock chambers 406A and 406B have a first port coupled to the factory interface 404 and a second port coupled to the transfer chamber 403A. The load lock chamber 406A and 406B are coupled to a pressure control system (not shown) which pumps down and vents the load lock chambers 406A and 406B to facilitate passing the substrates between the vacuum environment of the transfer chamber 403A and the substantially ambient (e.g., atmospheric) environment of the factory interface 404. The transfer chambers 403A, 403B have vacuum robots 442A, 442B disposed in the respective transfer chambers 403A, 403B. The vacuum robot 442A is capable of transferring substrates 421 (e.g., the substrate 200 during performance of the method 100) between the load lock chamber 406A, 406B, the process chambers 414A and 414F and a cooldown station 440 or a pre-clean station 444. The vacuum robot 442B is capable of transferring substrates 421 between the cooldown station 440 or pre-clean station 444 and the process chambers 414B, 414C, 414D, and 414E.

In some embodiments, the process chambers 414A, 414B, 414C, 414D, 414E, and 414F are coupled to the transfer chambers 403A, 403B. The process chambers 414A, 414B, 414C, 414D, 414E, and 414F may comprise, for example, substrate soaking chambers, atomic layer deposition (ALD) process chambers, physical vapor deposition (PVD) process chambers, remote plasma chambers, chemical vapor deposition (CVD) chambers, annealing chambers, or the like. The chambers may include any chambers suitable to perform all or portions of the methods described herein, as discussed above, such as one or more PVD chambers configured to deposit the low energy buffer layer and the high energy liner layer, one or more CVD chambers configured to deposit a conductive fill, and the like. In some embodiments, one or more optional service chambers (shown as 416A and 416B) may be coupled to the transfer chamber 403A. The service chambers 416A and 416B may be configured to perform other substrate processes, such as degassing, orientation, substrate metrology, cool down, and the like.

The system controller 402 controls the operation of the tool 400 using a direct control of the process chambers 414A, 414B, 414C, 414D, 414E, and 414F or alternatively, by controlling the computers (or controllers) associated with the process chambers 414A, 414B, 414C, 414D, 414E, and 414F and the tool 400. In operation, the system controller 402 enables data collection and feedback from the respective chambers and systems to optimize performance of the tool 400. The system controller 402 generally includes a central processing unit (CPU) 430, a memory 434, and a support circuit 432. The system controller 402 can be configured similar to the controller 340 described above. Software routines, such as methods as described above may be stored in the memory 434 and, when executed by the CPU 430, transform the CPU 430 into a specific purpose computer (system controller) 402. The software routines may also be stored and/or executed by a second controller (not shown) that is located remotely from the tool 400.

While the foregoing is directed to embodiments of the present disclosure, other and further embodiments of the disclosure may be devised without departing from the basic scope thereof.

The invention claimed is:

1. A method for processing a substrate of a certain size, the method comprising:

depositing a metal buffer layer on the substrate and within a feature disposed in a dielectric layer of the substrate using a first physical vapor deposition (PVD) process while applying less than or equal to 0.08 watts/$cm^2$ of RF bias power density to the substrate at a chamber pressure less than or equal to 3 mTorr;

depositing a metal liner layer atop the metal buffer layer, wherein the metal liner layer is deposited using a second PVD process at a chamber pressure of less than or equal to 3 mTorr while applying greater than 0.08 watts/$cm^2$ of RF bias power density to the substrate, wherein the feature includes a bottom and sidewalls, and wherein the metal liner layer is deposited atop the metal buffer layer along the bottom of the feature; and depositing a conductive layer atop the metal liner layer to fill the feature, wherein the conductive layer is deposited via a chemical vapor deposition (CVD) process, and wherein the conductive layer is a metal layer, wherein the metal buffer layer and the metal liner layer are composed of same materials.

2. The method of claim 1, wherein the metal buffer layer is composed of cobalt, copper, molybdenum, ruthenium, tantalum, titanium, tungsten, nitrides thereof, and combinations of the foregoing, and wherein the metal liner layer is composed of cobalt, copper, molybdenum, ruthenium, tantalum, titanium, tungsten, nitrides thereof, and combinations of the foregoing.

3. The method of claim 1, wherein the metal buffer layer is deposited to a thickness of at least about 5 angstroms.

4. The method of claim 3, wherein the metal liner layer is deposited to a thickness of at least about 5 angstroms.

5. The method of claim 1, wherein the metal buffer layer and the metal liner layer are deposited in a same PVD chamber without a vacuum break.

6. The method of claim 1, wherein the metal buffer layer and the metal liner layer are deposited in different PVD chambers.

7. The method of claim 1, wherein the metal buffer layer and the metal liner layer are deposited in different PVD chambers without a vacuum break.

8. The method of claim 1, wherein the conductive layer is at least one of cobalt, copper, molybdenum, or tungsten.

9. A non-transitory computer readable medium, having instructions stored thereon that, when executed, cause a method to be performed, the method comprising:

depositing a metal buffer layer on a substrate of a certain size and within a feature disposed in a dielectric layer of the substrate using a first physical vapor deposition (PVD) process while applying less than or equal to 0.08 watts/$cm^2$ of RF bias power density to the substrate at a chamber pressure less than or equal to 3 mTorr;

depositing a metal liner layer atop the metal buffer layer, wherein the metal liner layer is deposited using a second PVD process at a chamber pressure of less than or equal to 3 mTorr while applying greater than 0.08 watts/$cm^2$ of RF bias power density to the substrate, wherein the feature includes a bottom and sidewalls, and wherein the metal liner layer is deposited atop the metal buffer layer along the bottom of the feature; and depositing a conductive layer atop the metal liner layer to fill the feature, wherein the conductive layer is deposited via a chemical vapor deposition (CVD) process, and wherein the conductive layer is a metal layer, wherein the metal buffer layer and the metal liner layer are composed of same materials.

10. The non-transitory computer readable medium of claim 9, wherein the metal liner layer is deposited atop the metal buffer layer without a vacuum break.

11. A system for processing a substrate of a certain size, the system comprising:

a first PVD chamber configured to deposit a metal buffer layer on the substrate and within a feature disposed in a dielectric layer of the substrate, wherein the first PVD chamber is configured to deposit the metal buffer layer using a first physical vapor deposition (PVD) process while applying less than or equal to 0.08 watts/$cm^2$ of RF bias power density to the substrate at a chamber pressure less than or equal to 3 mTorr;

a second PVD chamber configured to deposit a metal liner layer atop the metal buffer layer, wherein the second PVD chamber is configured to deposit the metal liner layer using a second PVD process at a chamber pressure of less than or equal to 3 m Torr while applying greater than 0.08 watts/$cm^2$ of RF bias power density to the substrate, wherein the feature includes a bottom and sidewalls, and wherein the metal liner layer is deposited atop the metal buffer layer along the bottom of the feature; and a chemical vapor deposition (CVD) chamber configured to depositing a conductive layer atop the metal liner layer to fill the feature, wherein the conductive layer is a metal layer, wherein the metal buffer layer and the metal liner layer are composed of same materials.

12. The system of claim 11, wherein the first PVD chamber and the second PVD chamber are a same chamber.

13. The system of claim 11, wherein the first PVD chamber and the second PVD chamber are different chambers.

14. The system of claim 11, further comprising, a vacuum substrate transfer chamber having the first PVD chamber and the second PVD chamber coupled thereto.

* * * * *